United States Patent
Kimura et al.

(10) Patent No.: US 7,563,557 B2
(45) Date of Patent: Jul. 21, 2009

(54) POLYAMIDE

(75) Inventors: Masashi Kimura, Fuji (JP); Takayuki Kanada, Fuji (JP); Hiroyuki Hanahata, Sizuoka (JP)

(73) Assignee: Asahi Kasei EMD Corporation, Tokyo (JP)

( * ) Notice: Subject to any disclaimer, the term of this patent is extended or adjusted under 35 U.S.C. 154(b) by 239 days.

(21) Appl. No.: 11/571,311

(22) PCT Filed: Jul. 11, 2005

(86) PCT No.: PCT/JP2005/012730

§ 371 (c)(1),
(2), (4) Date: Dec. 27, 2006

(87) PCT Pub. No.: WO2006/008991

PCT Pub. Date: Jan. 26, 2006

(65) Prior Publication Data

US 2007/0248910 A1    Oct. 25, 2007

(30) Foreign Application Priority Data

Jul. 16, 2004  (JP) .............................. 2004-210575

(51) Int. Cl.
  *G03F 7/037*  (2006.01)
  *C08G 69/12*  (2006.01)
(52) U.S. Cl. .............. 430/270.1; 430/283.1; 430/288.1; 528/310; 528/353
(58) Field of Classification Search .............. 430/270.1, 430/283.1, 288.1; 528/26, 310, 337, 338, 528/345, 340, 353; 522/99, 164
See application file for complete search history.

(56) References Cited

U.S. PATENT DOCUMENTS

| 4,115,368 | A | * | 9/1978 | Roth et al. ................. | 528/229 |
| 6,162,580 | A |   | 12/2000 | Matsuoka et al. ........ | 430/283.1 |
| 6,482,569 | B1 | * | 11/2002 | Matsuoka et al. ........ | 430/283.1 |
| 2004/0146801 | A1 |   | 7/2004 | Banba et al. ................ | 430/191 |
| 2005/0244739 | A1 |   | 11/2005 | Kanatani et al. .......... | 430/270.1 |

FOREIGN PATENT DOCUMENTS

| JP | 5-027245 | 2/1993 |
| JP | 6-342211 | 12/1994 |
| JP | 7-179604 | 7/1995 |
| JP | 2826940 | 11/1998 |
| JP | 11-271973 | 10/1999 |
| JP | 2000-347404 | 12/2000 |
| JP | 2001-125266 | 5/2001 |
| JP | 2001-154365 | 6/2001 |
| JP | 2002-308986 | 10/2002 |
| JP | 3332278 | 10/2002 |
| JP | 2004-132995 | 4/2004 |
| WO | 2004/008252 | 1/2004 |

OTHER PUBLICATIONS

English Language Abstract of JP 2004-132995.
English Language Abstract of JP 11-271973.
English Language Abstract of JP 2002-308986.
English Language Abstract of JP 2000-347404.
English Language Abstract of JP 6-342211.
English Language Abstract of JP 2826940.
English Language Abstract of JP 2001-154365.
English Language Abstract of JP 5-027245.
English Language Abstract of JP 2001-125266.
English Language Abstract of JP 7-179604.
English Language Abstract of JP 3332278.

* cited by examiner

*Primary Examiner*—Cynthia H Kelly
*Assistant Examiner*—Anca Eoff
(74) *Attorney, Agent, or Firm*—Greenblum & Bernstein, P.L.C.

(57) ABSTRACT

A polyamide having a structure represented by the chemical formula (1):

[Formula 1]

$$\left(\begin{array}{c}\underset{\underset{R_1O-C}{\overset{O}{\|}}}{\overset{O}{\|}}\overset{O}{\underset{\|}{C}}-\overset{H}{\underset{}{N}}-Y_1-\overset{H}{\underset{}{N}}\\X_1\\\overset{}{\underset{\|}{C}}-OR_2\\O\end{array}\right)_m\left(\begin{array}{c}\overset{O}{\underset{\|}{C}}\overset{O}{\underset{\|}{C}}-\overset{H}{\underset{}{N}}-Y_2-\overset{H}{\underset{}{N}}\\X_2\\Z\end{array}\right)_n$$

(1)

wherein m and n represent an integer satisfying $m \geq 1$, $n \geq 1$, $2 \leq (m+n) \leq 150$, $0.3 \leq m/(m+n) \leq 0.9$, $R_1$ and $R_2$ represent at least one monovalent organic group containing a photopolymerizable unsaturated bond, $X_1$ represents at least one tetravalent aromatic group, $X_2$ represents at least one trivalent aromatic group, $Y_1$ and $Y_2$ represent at least one divalent organic group, and Z represents at least one monovalent organic group selected from mono-substituted amino and imido groups.

13 Claims, No Drawings

POLYAMIDE

TECHNICAL FIELD

The present invention relates to a polyamide which is a precursor of a heat resistant resin, a resin composition having photosensitivity comprising the polyamide, a process for forming a cured relief pattern formed from the resin composition and a semiconductor device comprising the cured relief pattern and a process for manufacturing the same. More specifically, the present invention relates to a polyamide as a precursor for a polyamide-imide resin which has high heat resistance and can be preferably used for purposes such as insulating materials of electronic parts and surface protection films, interlayer insulating films and α-ray shielding films in semiconductor devices.

BACKGROUND ART

Conventionally, coating films composed of a polyimide resin having combined excellent heat resistance, electrical properties and mechanical properties have been widely used for insulating materials of electronic parts and surface protection films, interlayer insulating films and α-ray shielding films in semiconductor devices.

For forming such polyimide resin coating films, a non-photosensitive polyimide resin precursor composition or a photosensitive polyimide resin precursor composition may be used. By applying a material provided in the latter form on a substrate, exposing the material to an active light through a desired patterning mask, developing it and then heating it, a cured relief pattern layer formed from a polyimide resin having heat resistance can be more easily formed.

Accordingly, when a polyimide resin is used as a coating film for which no cured relief pattern needs to be formed, the polyimide resin precursor composition may be non-photosensitive or photosensitive. However, when a polyimide resin is used for manufacturing a semiconductor device comprising a cured relief pattern layer formed from the polyimide resin, photosensitive polyimide resin precursor compositions have an advantage over non-photosensitive polyimide resin precursor compositions in that production steps can be significantly reduced.

When photosensitive polyimide resin precursor compositions have been first used, exposure to g-line (wavelength: 436 nm) from a ultra-high pressure mercury lamp has been generally performed, but now exposure to i-line (wavelength: 365 nm) having a higher resolution is general. Photosensitive polyimide resin precursor compositions with high i-line transmittance are preferred as a composition used for i-line exposure. A composition comprising a polyimide resin precursor obtained by condensing diphenyl ether-3,3',4,4'-tetracarboxylic acid and a diamine compound and the like are proposed (see, for example, JP-A-6-342211).

Recently, methods of mounting semiconductor devices on printed wiring boards have been shifting from conventional mounting methods using metal pins and tin—lead eutectic soldering to methods comprising bringing a polyimide resin coating film into direct contact with solder bumps, such as CSP (chip size packaging), which enable higher density mounting. In other words, polyimide resin coating films have come into contact with flux in the solder bump reflow process, requiring even higher heat resistance.

Also, in the steps of manufacturing semiconductor devices, there are many attempts to increase the diameter of a silicon wafer which is a substrate to 300 mm for high efficiency and lowering of the cost. In the process of applying a photosensitive polyimide resin precursor composition to a silicon wafer and forming it into a polyimide resin coating film by heating, the silicon wafer is warped due to residual stress. Thus, since polyimide resin coating films have begun to be used for silicon wafers with a larger diameter, further reduction of residual stress is now required.

However, generally many polyimide resin coating films obtained from aforementioned composition for i-line exposure have a lower glass transition temperature and higher residual stress than polyimide resin coating films obtained from a composition for g-line exposure. Thus, various methods for improving the heat resistance, typically the glass transition temperature, of a polyimide resin coating film are proposed. For example, a composition obtained by adding a melamine resin to a photosensitive polyimide resin precursor composition is proposed (see International Publication No. WO2004/008252). Various methods for reducing residual stress of polyimide resin coating films are also proposed. For example, a composition comprising a polyimide resin precursor obtained by condensing a tetracarboxylic acid compound containing a repeating unit composed of siloxane with a diamine compound is proposed (see JP-A-2001-154365).

JP-A-5-27245 discloses a polyamide resin obtained by reacting an acid component having a specific structure such as 5-hydroxyisophthalic acid dodecanoate chloride and an acid component having a specific structure such as terephthalic acid in a specific molar ratio with a diamine component such as diaminodiphenyl ether, and a composition containing the resin. However, the resin is a polyamide used for liquid crystal alignment layers, but not a polyamide for a precursor of heat resistant resins.

As described above, in the technical field of photosensitive polyimide, a method of improving the glass transition temperature of a polyimide resin coating film after curing and a method of improving the glass transition temperature of a polyimide resin coating film after curing with maintaining the low residual stress of the film are required.

Patent Document 1: JP-A-6-342211
Patent Document 2: International Publication No. WO2004/008252
Patent Document 3: JP-A-2001-154365
Patent Document 4: JP-A-5-27245

DISCLOSURE OF THE INVENTION

Problems to be Solved by the Invention

An object of the present invention is to provide a polyamide which is formed into a resin having high heat resistance by heating. Another object of the present invention is to provide a polyamide which is formed into not only a resin having high heat resistance by heating but also a coating film having low residual stress after curing. Still another object of the present invention is to provide a resin composition having negative sensitivity comprising the polyamide. Yet another object of the present invention is to provide a process for forming a cured relief pattern using the composition, a process for manufacturing a semiconductor device comprising the process and a semiconductor device comprising a coating film composed of a resin obtained by curing the resin composition.

Means for Solving the Problems

The present inventors have come to an idea to improve the heat resistance of a resin after curing reaction by heating by copolycondensation of a compound containing a heat crosslining group in a polyimide resin precursor obtained by polycondensation of a tetracarboxylic acid compound and a diamine compound. As a result of intensive studies of the present inventors, it has been found that a polyamide obtained by copolycondensation of a phthalic acid compound containing a specific functional group with a tetracarboxylic acid compound improves heat resistance, and use of a diamine unit containing a siloxane bond for part of the diamine units which the polyamide has reduces the residual stress of a coating film after curing, and the present invention has been completed.

Accordingly, a first aspect of the present invention is a polyamide comprising a structure represented by the chemical formula (1):

[Formula 1]

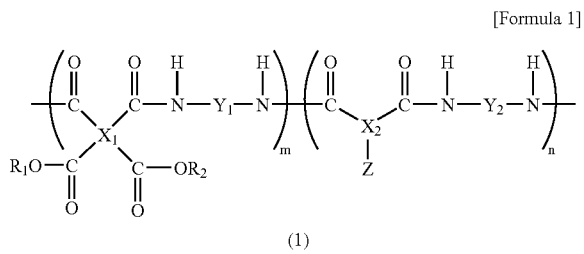

(1)

wherein m and n are an integer satisfying $m \geq 1$, $n \geq 1$, $2 \leq (m+n) \leq 150$ and $0.3 \leq m/(m+n) \leq 0.9$, repeating units may be arranged blockwise or randomly, $R_1$ and $R_2$ each independently represent at least one monovalent organic group containing a photopolymerizable unsaturated bond, a —$COOR_1$, group and a —$COOR_2$ group are each at an ortho position relative to a —CONH— group adjacent thereto, $X_1$ represents at least one tetravalent aromatic group, $X_2$ represents at least one trivalent aromatic group, $Y_1$ and $Y_2$ each independently represent at least one divalent organic group and Z represents at least one monovalent organic group selected from the groups represented by the following chemical formula (2):

[Formula 2]

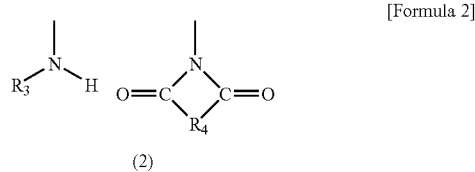

(2)

wherein $R_3$ represents at least one monovalent organic group having 1 to 9 carbon atoms and $R_4$ represents at least one divalent organic group having 1 to 9 carbon atoms.

In the polyamide of the present invention, part of $Y_1$ and $Y_2$ described above is preferably a divalent siloxane group represented by the following chemical formula (3):

[Formula 3]

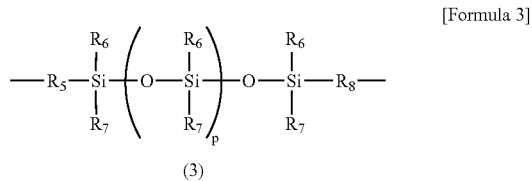

(3)

wherein p represents an integer of 0 to 50, $R_5$ and $R_8$ represent a divalent hydrocarbon group which may be the same or different and $R_6$ and $R_7$ represent a monovalent hydrocarbon group which may be the same or different.

A second aspect of the present invention is a resin composition having negative photosensitivity, comprising 100 parts by mass of the polyamide and 0.5 to 20 parts by mass of a photopolymerization initiator.

A third aspect of the present invention is a process for forming a cured relief pattern, comprising the steps of: applying the resin composition to a substrate, exposing the resulting coating film to an active light through a patterning mask or directly irradiating the coating film with an actinic ray, dissolving and removing an unexposed portion or a non-irradiated portion of the coating film using a developer, and heating the resulting negative relief pattern at 200 to 400° C.

In the process for forming a cured relief pattern of the present invention, the active light is preferably i-line.

A fourth aspect of the present invention is a process for manufacturing a semiconductor device, comprising the process for forming a cured relief pattern.

A fifth aspect of the present invention is a semiconductor device comprising a coating film composed of a resin obtained by curing the resin composition.

Advantages of the Invention

The polyamide of the present invention can be used as a precursor of a polyamide-imide resin excellent in heat resistance, or a precursor of a polyamide-imide resin excellent in heat resistance and having reduced residual stress.

The resin composition of the present invention has an advantage that a cured relief pattern can be easily formed since the resin composition has negative photosensitivity and the polyamide-imide resin after heat-curing is excellent in heat resistance, or excellent in heat resistance and has reduced residual stress.

The process for forming a cured relief pattern of the present invention has an advantage that a cured relief pattern formed from a polyamide-imide resin coating film excellent in heat resistance or excellent in heat resistance and having reduced residual stress can be easily formed on a substrate.

The process for manufacturing a semiconductor device of the present invention has an advantage that a semiconductor device comprising a cured relief pattern excellent in heat resistance or excellent in heat resistance and having reduced residual stress as an interlayer insulating film or a surface protection film can be easily manufactured.

The semiconductor device of the present invention is a semiconductor device comprising a cured relief pattern excellent in heat resistance or excellent in heat resistance and having reduced residual stress as an interlayer insulating film or a surface protection film.

BEST MODE FOR CARRYING OUT THE INVENTION

The present invention is described in detail below.

<Polyamide and Resin Composition>
The components constituting the polyamide of the present invention and the resin composition of the present invention are described in detail below.

(A) Polyamide
The polyamide of the present invention comprises a structure represented by the following chemical formula (1). The polyamide can be formed into a resin composition having negative photosensitivity by adding a photopolymerization initiator, since the unsaturated bond which the organic groups $R_1$ and $R_2$ have is photopolymerizable. Also, the —$COOR_1$, group and the —$COOR_2$ group form an imide bond with the —CONH— group adjacent thereto by heating at 200 to 400° C., whereby the polyamide is converted to a polyamide-imide resin.

[Formula 4]

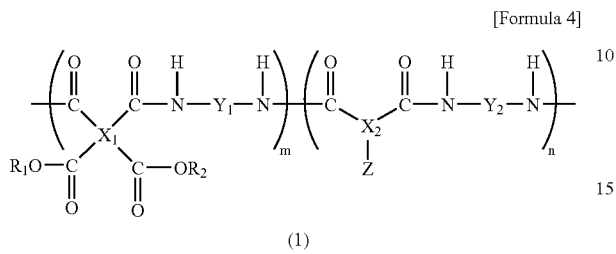

(1)

wherein m and n are an integer satisfying m≧1, n≧1, 2≦(m+n)≦150 and 0.3≦m/(m+n)≦0.9, repeating units may be arranged blockwise or randomly, $R_1$ and $R_2$ each independently represent at least one monovalent organic group containing a photopolymerizable unsaturated bond, a —$COOR_1$, group and a —$COOR_2$ group are each at an ortho position relative to a —CONH— group adjacent thereto, $X_1$ represents at least one tetravalent aromatic group, $X_2$ represents at least one trivalent aromatic group, $Y_1$ and $Y_2$ each independently represent at least one divalent organic group and Z represents at least one monovalent organic group selected from the groups represented by the following chemical formula (2):

[Formula 5]

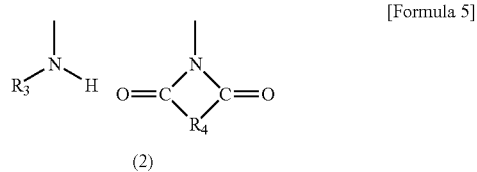

(2)

wherein $R_3$ represents at least one monovalent organic group having 1 to 9 carbon atoms and $R_4$ represents at least one divalent organic group having 1 to 9 carbon atoms.

Preferably, $X_1$ in the chemical formula (1) is at least one tetravalent aromatic group selected from the groups represented by the following structures in view of high i-line transmittance.

[Formula 6]

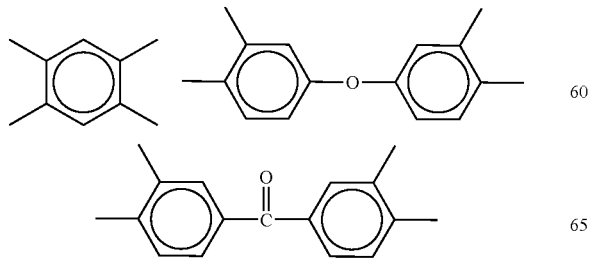

-continued

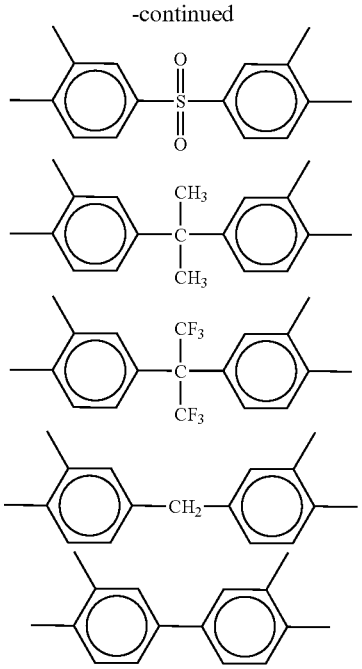

Preferably, $X_2$ in the chemical formula (1) is at least one trivalent aromatic group selected from the groups represented by the following structures, more preferably an aromatic group obtained by removing a carboxylic acid group and an amino group from 5-aminoisophthalic acid.

[Formula 7]

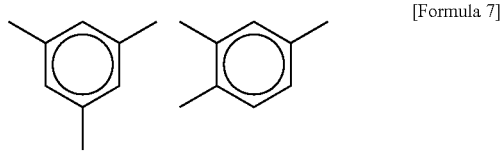

Preferably, $Y_1$ and $Y_2$ in the chemical formula (1) are at least one divalent organic group selected from the group consisting of divalent aromatic groups and divalent organic groups containing a siloxane bond. More preferably, part of $Y_1$ and $Y_2$ is a divalent aromatic group and the rest is a divalent organic group containing a siloxane bond. Herein, $Y_1$ and $Y_2$ may be the same or different.

Preferably, the divalent aromatic group is at least one group selected from the groups represented by the following structures in view of high i-line transmittance.

[Formula 8]

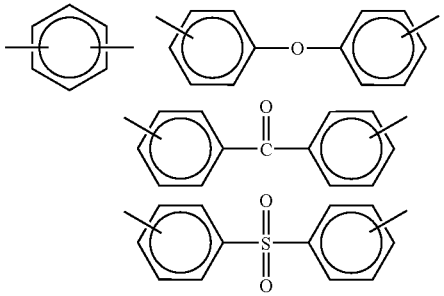

-continued

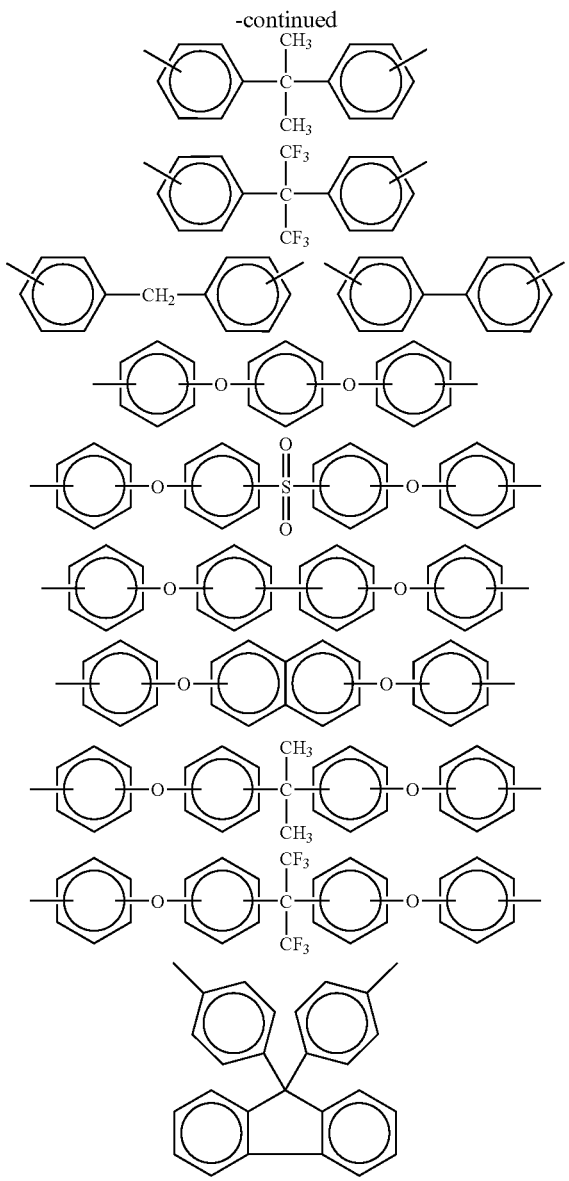

[Formula 9]

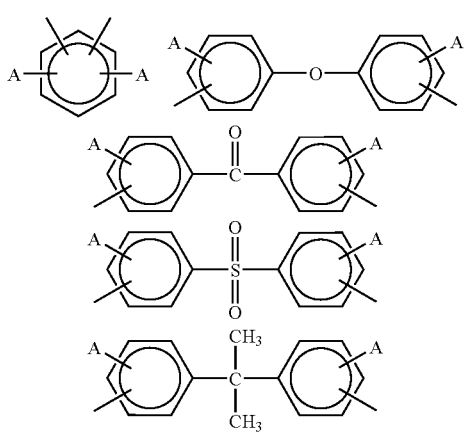

-continued

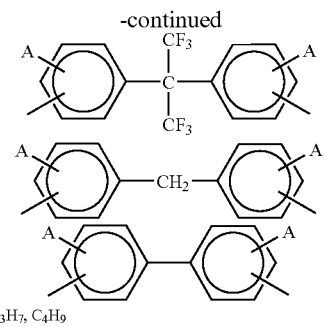

A = CH₃, C₂H₅, C₃H₇, C₄H₉

Preferably, the divalent organic group containing a siloxane bond is at least one group represented by the chemical formula (3):

[Formula 10]

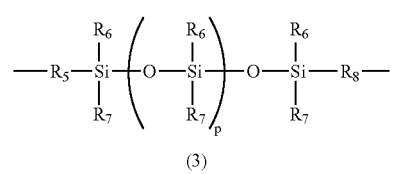

(3)

wherein p represents an integer of 0 to 50, $R_5$ and $R_8$ represent a divalent hydrocarbon group which may be the same or different and $R_6$ and $R_7$ represent a monovalent hydrocarbon group which may be the same or different.

Preferably, $R_5$ and $R_8$ in the chemical formula (3) are at least one divalent organic group selected from the group consisting of a methylene group, an ethylene group, a propylene group, a butylene group and a phenylene group. Preferably, $R_6$ and $R_7$ are at least one monovalent organic group selected from the group consisting of a methyl group, an ethyl group, a propyl group, a butyl group and a phenyl group. Preferably, the number p of repeating units is an integer of 2 to 50.

Such a divalent organic group containing a siloxane bond can be introduced into polyamide using a diaminopolysiloxane compound. X22-161AS, X22-161A and X22-161B (manufactured by Shin-Etsu Chemical Co., Ltd.) and FM3311 (manufactured by CHISSO CORPORATION) can be preferably used as specific examples of the diaminopolysiloxane compounds. The diaminopolysiloxane compound has a number average molecular weight of preferably 400 to 4000, more preferably 800 to 2000. When the molecular weight is 400 or more, the residual stress is advantageously reduced and when the molecular weight is 4000 or less, amide polycondensation reaction for producing polyamide tends to proceed smoothly.

(Synthesis of Half Acid/Half Ester)

The polyamide of the present invention can be preferably synthesized in the following manner.

First, 1 mole of an aromatic tetracarboxylic dianhydride containing a tetravalent aromatic group $X_1$ and 2 moles of an alcohol containing a photopolymerizable unsaturated bond are allowed to react to synthesize a dicarboxylic acid (hereinafter "half acid/half ester") in which two of the four carboxylic acid groups form an ester bond and the remaining two are acid.

Preferred examples of aromatic tetracarboxylic dianhydrides described above include pyromellitic anhydride, diphenyl ether-3,3',4,4'-tetracarboxylic dianhydride, benzophenone-3,3',4,4'-tetracarboxylic dianhydride, biphenyl-3,3',4,4'-tetracarboxylic dianhydride, diphenylsulfone-3,3',4,4'-tetracarboxylic dianhydride, diphenylmethane-3,3', 4,4'-tetracarboxylic dianhydride, 2,2-bis(3,4-phthalic anhydride) propane and 2,2-bis(3,4-phthalic anhydride)-1,1,1,3,3,3-hexafluoropropane. These may be used not only alone but also in a mixture of two or more.

Preferred examples of alcohols containing a photopolymerizable unsaturated bond described above include 2-hydroxyethyl acrylate, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butoxypropyl acrylate, 2-hydroxy-3-phenoxypropyl acrylate, 2-hydroxy-3-t-butoxypropyl acrylate, 2-hydroxy-3-cyclohexyloxypropyl acrylate, 2-hydroxyethyl methacrylate, 1-methacryloyloxy-3-propyl alcohol, 2-methacrylamidoethyl alcohol, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate. These may be used not only alone but also in a mixture of two or more.

The above alcohols containing a photopolymerizable unsaturated bond may be used in combination with saturated aliphatic alcohol having 1 to 4 carbon atoms, such as methanol, ethanol, n-propanol, isopropanol, n-butanol or tert-butanol.

A half acid/half ester can be obtained by dissolving and mixing the above-described aromatic tetracarboxylic dianhydride and an alcohol containing a photopolymerizable unsaturated bond in a solvent with stirring in the presence of a basic catalyst such as pyridine and esterifying them.

Amides, sulfoxides, tetramethylurea, ketones, esters, lactones, ethers, halogenated hydrocarbons and hydrocarbons are preferred as the solvent. Examples thereof include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene. Of these, solvents which completely dissolve a half acid/half ester and a polyamide-imide resin precursor, which is an amide polycondensation product of the half acid/half ester and a diamine compound, are more preferred. Examples thereof include N-methyl-2-pyrrolidone, N,N-dimethylacetamide, N,N-dimethylformamide, dimethyl sulfoxide, tetramethylurea and gamma butyrolactone. These solvents may be used alone or in a mixture according to need.

(Synthesis of Blocked Phthalic Acid Compound)

Secondly, 1 mole of at least one compound selected from the group consisting of phthalic acid substituted by an amino group and containing a trivalent aromatic group $X_2$, isophthalic acid substituted by an amino group and terephthalic acid substituted by an amino group (hereinafter "phthalic acid compound") and 1 mole of a compound reactive with amino groups are allowed to react to synthesize a compound (hereinafter "blocked phthalic acid compound") in which the amino group of the phthalic acid compound is blocked by a compound containing a heat crosslinking group or a protecting group described later (hereinafter "blocking agent"). These may be used alone or in a mixture.

The above-described blocked phthalic acid compound can be obtained by reacting the amino group of a phthalic acid compound with an acid chloride, an acid anhydride, an isocyanate compound or an epoxy compound containing a heat crosslinking group (hereinafter "heat crosslinking compound"). Groups which induce crosslinking reaction at a range of 150 to 400° C. are desired as the heat crosslinking group. Preferred examples thereof include a norbornene group, a glycidyl group, a cyclohexene group, an ethynyl group, an allyl group, an aldehyde group, a benzocyclobutene group, a furyl group, a furfuryl group, a dimethoxydimethylamino group, a dihydroxydimethylamino group, an alkynyl group, an alkenyl group, an oxetane group, a methacrylate group, an acrylate group, a cyano group, a thiophene group, a maleimide group and a guananine group. When the phthalic acid compound has a structure blocked by the heat crosslinking group, intermolecular crosslinking with these heat crosslinking groups can be performed in the step of curing a polyamide resin coating film by heating, making it possible to improve the heat resistance of the coating film.

The acid chloride containing a heat crosslinking group is preferably acid chloride containing an unsaturated double bond or triple bond, more preferably acid chloride having 3 to 11 carbon atoms and containing a cyclic or acyclic alkenyl group or acid chloride having 3 to 11 carbon atoms and containing a cyclic or acyclic alkynyl group. Specific examples thereof include 3-cyclohexene-1 carbonylchloride, 2-furancarbonylchloride, crotonoylchloride, cinnamoylchloride, methacryloylchloride, acryloylchloride, p-styrenesulfonyl chloride and thiophene-2-acetyl chloride.

The acid anhydride containing a heat crosslinking group is preferably acid anhydride containing an unsaturated double bond or triple bond, more preferably acid anhydride having 4 to 12 carbon atoms and containing a cyclic or acyclic alkenyl group or acid anhydride having 4 to 12 carbon atoms and containing a cyclic or acyclic alkynyl group. Specific examples thereof include 5-norbornene-2,3-dicarboxylic anhydride, exo-3,6-epoxy-1,2,3,6-tetrahydrophthalic anhydride, 3-ethynyl-1,2-phthalic anhydride, 4-ethynyl-1,2-phthalic anhydride, cis 4-cyclohexene-1,2-dicarboxylic anhydride, 1-cyclohexene-1,2-dicarboxylic anhydride, maleic anhydride, citraconic anhydride, itaconic anhydride, endomethylenetetrahydrophthalic anhydride, methylendomethylenetetrahydrophthahc anhydride, allylsuccinic anhydride and methyltetrahydrophthalic anhydride.

The isocyanate containing a heat crosslinking group is preferably isocyanate containing an unsaturated double bond or triple bond, more preferably isocyanate having 5 to 15 carbon atoms and containing a cyclic or acyclic alkenyl group or isocyanate having 5 to 15 carbon atoms and containing a cyclic or acyclic alkynyl group. Specific examples thereof include 3-isopropenyl-α,α-dimethylbenzyl isocyanate.

The epoxy compound containing a heat crosslinking group is preferably epoxy compounds containing an unsaturated double bond or triple bond, more preferably epoxy compounds having 5 to 15 carbon atoms and containing a cyclic or acyclic alkenyl group or epoxy compounds having 5 to 15 carbon atoms and containing a cyclic or acyclic alkynyl group. Specific examples thereof include glycidyl methacrylate and allyl glycidyl ether.

The blocked phthalic acid compound can also be obtained by protecting the amino group of a phthalic acid compound by a protecting group such as a urea group, a urethane group, an ester group, an acyl group, an aralkyl group or a silicone group. When the phthalic acid compound has a structure protected by the protecting group, the protecting group is eliminated in the step of heat-curing a polyamide resin film to regenerate the amino group, and the amino group reacts with part of the polymer main chain or the terminal so that intermolecular crosslinking can occur, making it possible to improve the heat resistance.

To protect the amino group of the phthalic acid compound by a urea protecting group, the phthalic acid compound may be reacted with a monoisocyanate compound. Examples of such monoisocyanate compounds include phenyl isocyanate, n-butyl isocyanate, n-octadecyl isocyanate, o-tolyl isocyanate and 2-acryloyloxyethyl isocyanate and 2-methacryloyloxyethyl isocyanate.

To protect the amino group of the phthalic acid compound by a urethane protecting group, the phthalic acid compound may be reacted with alkoxycarbonyl chloride or dialkyl carbonate. Examples of such alkoxycarbonyl groups include a benzyloxycarbonyl group, a methyloxycarbonyl group, an ethyloxycarbonyl group, a propyloxycarbonyl group, an isobutyloxycarbonyl group, a tert-butyloxycarbonyl group, a p-nitrobenzyloxycarbonyl group, a p-methoxybenzyloxycarbonyl group, an isobornylbenzyloxycarbonyl group and a p-biphenylisopropylbenzyloxycarbonyl group.

To protect the amino group of the phthalic acid compound by an acyl protecting group, the phthalic acid compound may be reacted with acyl chloride. Examples of such acyl groups include a formyl group, a phthaloyl group, dithiasuccinoyl group, a tosyl group, a mesyl group, an o-nitrophenylsulphenyl group, an o-nitropyridinesulfenyl group, a diphenylphosphinyl group, an acryloyl group, a methacryloyl group, a crotonoyl group and a cinnamoyl group.

To protect the amino group of the phthalic acid compound by an aralkyl protecting group, the phthalic acid compound may be reacted with aralkyl chloride. Examples of such aralkyl protecting groups include a triphenylmethyl group.

To protect the amino group of the phthalic acid compound by a silicone protecting group, the phthalic acid compound may be reacted with a silylating agent. Examples of such silicone protecting groups include a trimethylsilyl group, a triethylsilyl group, a t-butyldimethylsilyl group and a t-butyldiphenylsilyl group. Examples of such silylating agents include trimethylchlorosilane, hexamethyldisilazane, N,O-bis(trimethylsilyl)acetamide, bis(trimethylsilyl)trifluoroacetamide, N,N-dimethylaminotrimethylsilane, dimethylaminotrimethylsilane, trimethylsilyldiphenylurea and bis(trimethylsilyl)urea.

Blocked phthalic acid compounds in which the phthalic acid compound is 5-aminoisophthalic acid (hereinafter abbreviated as "AIPA") are preferred, because they make it possible to obtain a polyamide-imide resin with high heat resistance after heat-curing. Compounds in which a heat crosslinking group containing a heat crosslinking double bond is introduced into the amino group of AIPA are preferred because heat resistance after heat-curing can be further improved. Examples thereof include a reactant (AIPA-N) of 5-norbornene-2,3-dicarboxylic anhydride and AIPA. Also, compounds in which a protecting group containing a photopolymerizable double bond is introduced into the amino group of AIPA are preferred because photosensitive properties such as sensitivity and resolution in lithography are superior. Examples thereof include a reactant (AIPA-M) of 2-methacryloyloxyethyl isocyanate and AIPA.

By dissolving and mixing the phthalic acid compound and the above-described blocking agent with stirring in a solvent in the presence of a basic catalyst such as pyridine, the reaction between the amino group and the blocking agent proceeds and a desired blocked phthalic acid compound can be obtained.

Amides, sulfoxides, tetramethylurea, ketones, esters, lactones, ethers, halogenated hydrocarbons and hydrocarbons are preferred as the solvent. Examples thereof include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene. Of these, solvents which completely dissolve a half acid/half ester and a polyamide-imide resin precursor, which is an amide polycondensation product of the half acid/half ester and a diamine compound, are more preferred. Examples thereof include N-methyl-2-pyrrolidone, N,N-dimethylacetamide, N,N-dimethylformamide, dimethyl sulfoxide, tetramethylurea and gamma butyrolactone. These solvents may be used alone or in a mixture according to need.

Depending on the type of the blocking agent, for example, in the case of acid chloride, hydrogen chloride may be produced as a byproduct during the blocking reaction. In that case, to prevent contamination in the subsequent steps, the resultant is preferably reprecipitated with water, washed with water and dried, or passed through an ion exchange resin column to be accordingly purified.

(Synthesis of Polyamide)

Third, after the aforementioned half acid/half ester and the blocked phthalic acid compound are formed into mixed polyacid anhydride using a dehydration condensing agent, a mixture in which a diamine compound containing a divalent organic group $Y_1$ and a diamine compound containing a divalent organic group $Y_2$ are dissolved or dispersed in a solvent is added dropwise thereto to perform amide polycondensation, whereby an intended polyamide can be obtained.

The copolycondensation ratio of the half acid/half ester to the blocked phthalic acid compound is represented by $m/(m+n)$ in the chemical formula (1), which is preferably 0.3 to 0.9, more preferably 0.5 to 0.8 in a molar ratio. The $m/(m+n)$ ratio is preferably 0.9 or less, because the effect of improving heat resistance can be obtained, and the $m/(m+n)$ ratio is preferably 0.3 or more, because lithographic properties such as photosensitivity are excellent. The method of mixing the half acid/half ester and the blocked phthalic acid compound is not particularly limited. Those which have been each purified and isolated may be mixed and redissolved in the solvent, isolated one may be redissolved in the reaction solution of the other, or reaction solutions separately prepared may be mixed.

Preferred examples of dehydration condensing agents include dicyclohexylcarbodiimide, 1-ethoxycarbonyl-2-ethoxy-1,2-dihydroquinoline, 1,1'-carbonyldioxy-di-1,2,3-benzotriazole and N,N'-disuccinimidyl carbonate.

At least one diamine compound selected from the group consisting of divalent aromatic diamine compounds and the aforementioned diaminopolysiloxane compounds is preferred as the diamine compound. More preferably, part of $Y_1$ and $Y_2$ described above is a divalent aromatic group and the rest is a divalent organic group containing a siloxane bond.

Examples of aromatic diamine compounds described above include p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenyl sulfone, 3,4'-diaminodiphenyl sulfone, 3,3'-diaminodiphenyl sulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4'-bis(4-aminophenoxy)biphenyl, 4,4'-bis(3-aminophenoxy)biphenyl, bis[4-(4-aminophenoxy)phenyl]ether, bis[4-(3-aminophenoxy) phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-amnophenoxy)phenyl]hexafluoropropane, 1,4-bis(3-aminopropyldimethylsilyl)benzene, ortho-tolidinesulfone, 9,9-bis(4-aminophenyl)fluorene and diamine compounds in which some of hydrogen atoms on the benzene ring are substituted by at least one group selected from the group consisting of a methyl group, an ethyl group, a hydroxymethyl group, a hydroxyethyl group and a halogen atom. Examples of diamine compounds in which a hydrogen atom on the benzene ring is substituted include 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl and mixtures thereof.

After completion of the amidation reaction of the mixed polyacid anhydride and the diamine compound, precipitate in the reaction solution derived from the dehydration condensing agent, such as dicyclohexylurea, is filtrated according to need. Subsequently, a poor solvent for polyamide such as water, lower aliphatic alcohol or a mixture thereof is added to the reaction solution to precipitate polyamide. Further, precipitated polyamide is redissolved in the solvent, purified by repeating reprecipitation and vacuum dried to isolate the intended polyamide. To improve the purification degree, the polyamide solution may be passed through a column filled with an ion exchange resin swelled by an organic solvent to remove ionic impurities.

When an aromatic diamine compound and a diaminopolysiloxane compound are used in combination as the diamine compound, the ratio of aromatic diamine compound/diaminopolysiloxane compound in the polyamide of the present invention is preferably 98/2 to 80/20 (% by mole), more preferably 95/5 to 85/15 (% by mole). The copolycondensation ratio of the diaminopolysiloxane compound is preferably 2% by mole or more, because the effect of reducing residual stress is exhibited. The copolycondensation ratio is preferably 20% by mole or less, because the solubility in the solvent is high.

In addition, when an aromatic diamine compound and a diaminopolysiloxane compound are used in combination, the repeating unit derived from the aromatic diamine compound and the repeating unit derived from the diaminopolysiloxane compound are more preferably arranged blockwise to reduce the residual stress. Polyamide in which repeating units are arranged blockwise can be synthesized by the following production method.

First, a diluted solution of an aromatic diamine compound is added dropwise to the aforementioned mixed polyacid anhydride, and the mixture is stirred at 0 to 5° C. for 2 to 3 hours to prepare an oligomer block composed of the aromatic diamine compound and the acid component. Next, a diluted solution of the diaminopolysiloxane compound is added dropwise thereto, and the mixture is further reacted at room temperature for 2 to 3 hours to bond the diaminopolysiloxane compound and the oligomer block composed of the acid component.

(B) Photopolymerization Initiator

To prepare the resin composition having negative photosensitivity of the present invention, a photopolymerization initiator is added to the aforementioned polyamide. Preferred examples of photopolymerization initiators include the following compounds, and in terms of photosensitivity, in particular, oximes of (6) are more preferred. These may be used alone or in a mixture of two or more.

(1) Benzophenone and benzophenone derivatives such as methyl-o-benzoylbenzoate, 4-benzoyl-4'-methyldiphenyl ketone, dibenzyl ketone and fluorenone (2) Acetophenone derivatives such as 2,2'-diethoxyacetophenone, 2-hydroxy-2-methylpropiophenone and 1-hydroxycyclohexyl phenyl ketone (3) Thioxanthone and thioxanthone derivatives such as 2-methylthioxanthone, 2-isopropylthioxanthone and diethylthioxanthone (4) Benzyl and benzyl derivatives such as benzyl dimethyl ketal and benzyl-β-methoxyethyl acetal (5) Benzoin and benzoin derivatives such as benzoin methyl ether (6) Oximes such as 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime and 1-phenyl-3-ethoxypropanetrione-2-(O-benzoyl)oxime The photopolymerization initiator is added in an amount of preferably 0.5 to 20 parts by mass, more preferably 1 to 10 parts by mass based on 100 parts by mass of the polyamide of the present invention. The amount is preferably 0.5 parts by mass or more, because the photosensitivity is increased, and the amount is preferably 20 parts by mass or less, because the coating film can be sufficiently cured near to the substrate.

(C) Solvent

The viscosity of the resin composition having negative photosensitivity of the present invention is preferably adjusted by adding a solvent. Preferred examples of solvents include N,N-dimethylformamide, N-methyl-2-pyrrolidone, N-ethyl-2-pyrrolidone, N,N-dimethylacetamide, dimethyl sulfoxide, hexamethylphosphoramide, pyridine, cyclopentanone, γ-butyrolactone, α-acetyl-γ-butyrolactone, tetramethylurea, 1,3-dimethyl-2-imidazolinone and N-cyclohexyl-2-pyrrolidone, and these may be used alone or in combination of two or more. Of these, N-methyl-2-pyrrolidone and γ-butyrolactone are particularly preferred.

Such a solvent may be appropriately added to the resin composition of the present invention depending on the thickness or viscosity of the coating, preferably in an amount of 100 to 1000 parts by mass based on 100 parts by mass of the polyamide of the present invention.

To improve the storage stability with time of the resin composition of the present invention, an alcohol described below may also be used in combination in addition to the solvent described above.

Examples of such alcohols include monoalcohols such as methyl alcohol, ethyl alcohol, n-propyl alcohol, isopropyl alcohol, n-butyl alcohol, isobutyl alcohol, t-butyl alcohol, benzyl alcohol, ethyl lactate, butyl lactate, propylene glycol monomethyl ether, propylene glycol monoethyl ether, propylene glycol mono(n-propyl)ether, ethylene glycol monomethyl ether, ethylene glycol monoethyl ether, ethylene glycol mono(n-propyl)ether, ethylene glycol monophenyl ether, ethylene glycol monobenzyl ether, diethylene glycol monophenyl ether and dialcohols such as ethylene glycol and propylene glycol. Of these, benzyl alcohol and ethylene glycol monophenyl ether are particularly preferred. The content of these alcohols in the solvent is preferably 50% by mass or less because the solubility of polyamide is good.

(d) Monomer Containing Photopolymerizable Unsaturated Double Bond

A monomer containing a photopolymerizable unsaturated double bond (hereinafter "photopolymerizable monomer") can be added to the resin composition having negative photosensitivity of the present invention to improve photosensitive properties.

(Meth)acrylic compounds polymerizable by a photopolymerization initiator are preferred as such a photopolymerizable monomer. Examples thereof include polyethylene glycol diacrylate (the number of each ethylene glycol unit: 2 to 20), polyethylene glycol dimethacrylate (the number of each ethylene glycol unit: 2 to 20), poly(1,2-propylene glycol)diacrylate, poly(1,2-propylene glycol)dimethacrylate, pentaerythritol diacrylate, pentaerythritol dimethacrylate, glycerol diacrylate, glycerol dimethacrylate, dipentaerytiritol hexaacrylate, methylenebisacrylamide, N-methylolacrylamide, ethylene glycol diglycidyl ether-methacrylic acid adduct, glycerol diglycidyl ether-acrylic acid adduct, bisphenol A diglycidyl ether-acrylic acid adduct, bisphenol A diglycidyl ether-methacrylic acid adduct and N,N'-bis(2-methacryloyloxyethyl)urea. These may be used alone or in a mixture of two or more according to need.

The photopolymerizable monomer is added in an amount of preferably 0 to 50 parts by mass, more preferably 1 to 20 parts by mass based on 100 parts by mass of the polyamide of the present invention.

(e) Sensitizer

A sensitizer may be added to the resin composition having negative photosensitivity of the present invention as required to improve photosensitivity. Examples of such sensitizers include Michler's ketone, 4,4'-bis(diethylamino)benzophenone, 2,5-bis(4'-diethylaminobenzylidene)cyclopentanone, 2,6-bis(4'-diethylaminobenzylidene)cyclohexanone, 2,6-bis(4'-dimethylaminobenzylidene)-4-methylcyclohexanone, 2,6-bis(4'-diethylaminobenzylidene)-4-methylcyclohexanone, 4,4'-bis(dimethylamino)chalcone, 4,4'-bis(diethylamino)chalcone, 2-(4'-dimethylaminocinnamylidene)indanone, 2-(4'-dimethylaminobenzylidene)indanone, 2-(p-4'-dimethylaminobiphenyl)benzothiazole, 1,3-bis(4-dimethylaminobenzylidene)acetone, 1,3-bis(4-diethylaminobenzylidene)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N-ethylethanolamine, N-phenyldiethanolamine, N-p-tolyldiethanolamine, N-phenylethanolamine, N,N-bis(2-hydroxyethyl)aniline, 4-morpholinobenzophenone, isoamyl 4-dimethylaminobenzoate, isoamyl 4-diethylaminobenzoate, benzotriazole, 2-mercaptobenzimidazole, 1-phenyl-5-mercapto-1,2,3,4-tetrazole, 1-cyclohexyl-5-mercapto-1,2,3,4-tetrazole, 1-(tert-butyl)-5-mercapto-1,2,3,4-tetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-p)thiazole and 2-(p-dimethylaminobenzoyl)styrene. Of these, at least one sensitizer selected from the group consisting of benzotriazole, 2-mercaptobenzimidazole, 1-phenyl-5-mercapto-1,2,3,4-tetrazole, 1-cyclohexyl-5-mercapto-1,2,3, 4-tetrazole and 1-(tert-butyl)-5-mercapto-1,2,3,4-tetrazole is preferably added. These may be used alone or in a mixture of two or more.

The sensitizer is added in an amount of preferably 0 to 15 parts by mass, more preferably 1 to 10 parts by mass based on 100 parts by mass of the polyamide of the present invention.

(f) Polymerization Inhibitor

A polymerization inhibitor may be added to the resin composition having negative photosensitivity of the present invention as required to improve stability of the viscosity and the photosensitivity of the composition solution when storing. As such a polymerization inhibitor, for example, hydroquinone, N-nitrodiphenylamine, p-tert-butylcatechol, phenothiazine, N-phenylnaphthylamine, ethylenediaminetetraacetic acid, 1,2-cyclohexanediaminetetraacetic acid, glycol ether diaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxyamine ammonium salt, N-nitroso-N-(1-naphthyl)hydroxylamine ammonium salt and bis(4-hydroxy-3,5-di-tert-butyl)phenylmethane may be used.

The polymerization inhibitor is added-in an amount of preferably 0 to 5 parts by mass, more preferably 0.01 to 1 part by mass based on 100 parts by mass of the polyamide of the present invention.

(g) Heat Crossing Agent

A heat crosslinking agent capable of crosslinking polyamide or forming a crosslinking network per se may be added to the resin composition having negative photosensitivity of the present invention according to need when heat-curing a coating film to further enhance the heat resistance. As such a heat crosslinking agent, amino resins and derivatives thereof are preferably used. In particular, urea resins, glycol urea resins, hydroxyethylene urea resins, melamine resins, benzoguanamine resins and derivatives thereof are preferably used. The heat crosslinking agent is particularly preferably hexamethoxymethylated melamine.

The heat crosslinking agent is added in an amount of preferably 0 to 20 parts by mass, more preferably 3 to 15 parts by mass based on 100 parts by mass of the polyamide component.

(h) Other Additives

In addition to the above components, various additives such as a scattered light absorber, a coating film smoothing agent and a silane coupling agent may be added to the resin composition having negative photosensitivity of the present invention according to need.

<Process for Forming Cured Relief Pattern and Manufacturing Semiconductor Device>

The above-described resin composition having negative photosensitivity is used in the process for forming a cured relief pattern of the present invention. The cured relief pattern is produced by the following steps.

First, the composition is applied to a silicon wafer which is a substrate. At this stage, a silane coupling agent may be previously applied to the substrate in order to improve the adhesiveness between the composition and the substrate. For coating, spin coating using a spin coater, coating by a die coater, spray coating using a spray coater, dipping, printing, coating by a blade coater or roll coating may be used. Of these, spin coating is preferred because the film thickness can be easily controlled by changing the rotation number of the spin coater. Preferably, the coating film thickness of the composition is determined so that the final cured film has a film thickness of 0.1 to 20 μm.

Next, after pre-baking and drying the coating film at 80 to 120° C., the film is irradiated with active light in a desired pattern shape through a photomask. While X rays, electron beams, ultraviolet light or visible light may be used as active light, active light having a wavelength of 200 to 500 nm is preferably used, and i-line (365 nm) is particularly preferred. A contact aligner or a stepper is generally used as an aligner. Alternatively, a pattern may be directly formed on a coating film by laser irradiation of actinic rays. Subsequently, to improve photosensitivity, post exposure bake (PEB) or pre-development bake may be performed at any temperature for any period (preferably at a temperature of 40° C. to 120° C. for 10 seconds to 240 seconds) according to need.

Then, a negative relief pattern can be obtained by removing unirradiated parts by dissolving in a developer.

A good solvent for polyamide or a mixed solvent of a good solvent and a poor solvent for polyamide may be used as the developer used herein. Examples of such good solvents include N-methyl-2-pyrrolidone, N-acetyl-2-pyrrolidone, N,N-dimethylacetamide, N,N-dimethylformamide, dimethyl sulfoxide, gamma butyrolactone, α-acetyl-gamma butyrolactone, cyclopentanone and cyclohexanone. Examples of such poor solvents include toluene, xylene, methanol, ethanol, isopropanol, propylene glycol monomethyl ether acetate, propylene glycol monomethyl ether and water. When a mixed solvent of a good solvent and a poor solvent is used, the mixing ratio is adjusted depending on the solubility of the polyamide resin coating film to be developed or the developing method. Development may be performed by a method selected from dipping, paddling, rotary spraying and the like.

Then, the negative relief pattern formed by development is washed with a rinsing liquid to remove the developer. As the rinsing liquid, distilled water, methanol, ethanol, isopropanol, toluene, xylene, propylene glycol monomethyl ether acetate and propylene glycol monomethyl ether may be used alone or in a mixture.

Subsequently, the relief pattern of polyamide thus obtained is heated to 200 to 400° C. to induce cyclodehydration reaction and crosslinking reaction, whereby a cured relief pattern formed from a polyamide-imide resin excellent in heat resistance can be obtained. Such thermal cyclization reaction can be performed using a hot plate, an inert oven or a temperature-programmed oven in which a temperature program can be set. Air or inert gas such as nitrogen or argon may be used as ambient gas in thermal cyclization.

The cured relief pattern thus obtained can be preferably used for manufacturing a semiconductor device, while being used as a surface protection film, an interlayer insulating film or an α-ray shielding film in a semiconductor device fabricated on a substrate such as a silicon wafer in a process of manufacturing a semiconductor device.

EXAMPLES

The present invention is now described by means of Examples and Comparative Examples. The list of combination of polymer raw materials in each of the following synthetic examples is shown in Table 1.

(Synthesis of Polyamide)

Example 1

13.59 g (0.075 mol) of 5-aminoisophthalic acid, 68 g of γ-butyrolactone (hereinafter also "GBL") and 11.87 g (0.15 mol) of pyridine were introduced into a separable flask with a 1 L volume, and the mixture was stirred and heated to 50° C. in a water bath. 12.26 g (0.079 mol) of 2-methacryloyloxyethyl isocyanate diluted with 12 g of GBL was added thereto dropwise using a dropping funnel and the mixture was stirred at 50° C. for about 2 hours.

Disappearance of 5-aminoisophthalic acid was observed by high performance liquid chromatography (hereinafter also "HPLC") and then 22.07 g (0.075 mol) of biphenyl-3,3',4,4'-tetracarboxylic dianhydride, 20.11 g (0.155 mol) of 2-hydroxyethyl methacrylate, 11.87 g (0.15 mol) of pyridine and 84 g of GBL were introduced into the flask and mixed, and the mixture was stirred at 50° C. for 2 hours and then at room temperature for 10 hours.

Thereto was added dropwise 60.04 g (0.291 mol) of dicyclohexylcarbodiimide dissolved in 60 g of GBL in an ice bath over 15 minutes. Then, 60.25 g (0.139 mol) of bis[4-(4-aminophenoxy)phenyl]sulfone dissolved in 180 g of GBL was added thereto over about 30 minutes, and the mixture was stirred for 2 hours with keeping the temperature lower than 5° C. in the ice bath and then for 4 hours at room temperature after the ice bath was removed.

Subsequently, 15 g of ethanol was added thereto to terminate the reaction, and the mixture was diluted by further adding 130 g of GBL. Precipitate from the dehydration condensing agent (dicyclohexylurea) was removed by filtration under pressure. With stirring the reaction solution, a mixture of 700 g of water and 250 g of isopropanol was added thereto dropwise, and the polymer precipitated at that stage is separated and redissolved in 600 g of GBL. The solution in which the polymer was redissolved is added dropwise to 3 liter of ion exchange water with stirring to disperse and precipitate the polymer, and after collecting the polymer and washing it with water, the polymer was vacuum dried at 40° C. for 48 hours to give polyamide P-1.

The GPC weight average molecular weight of P-1 measured by gel permeation chromatography (hereinafter also "GPC") was 72000 in terms of polystyrene (column: Shodex KD-806M×2 manufactured by SHOWA DENKO K.K., solvent: DMF, flow rate: 1.0 ml/min).

Example 2

5.43 g (0.03 mol) of 5-aminoisophthalic acid, 27 g of GBL and 4.75 g (0.06 mol) of pyridine were introduced into a separable flask with a 1 L volume, and the mixture was stirred and heated to 50° C. in a water bath. 4.96 g (0.032 mol) of 2-methacryloyloxyethyl isocyanate diluted with 5 g of GBL was added thereto dropwise using a dropping funnel and the mixture was stirred at 50° C. for about 2 hours.

Disappearance of 5-aminoisophthalic acid was observed by HPLC and then 35.31 g (0.12 mol) of biphenyl-3,3',4,4'-tetracarboxylic dianhydride, 32.14 g (0.247 mol) of 2-hydroxyethyl methacrylate, 18.98 g (0.24 mol) of pyridine and 135 g of GBL were introduced into the flask and mixed, and the mixture was stirred at 50° C. for 2 hours and then at room temperature for 10 hours. Thereto was added dropwise 60.04 g (0.291 mol) of dicyclohexylcarbodiimide dissolved and diluted in 60 g of GBL in an ice bath over about 15 minutes, and then 52.77 g (0.122 mol) of bis[4-(4-aminophenoxy)phenyl]sulfone dissolved in 158 g of GBL was added thereto over about 30 minutes. The mixture was stirred for 2 hours with keeping the temperature lower than 5° C. in the ice bath.

Thereafter, 17.7 g (0.177 mol) of a diaminopolysiloxane compound (manufactured by CHISSO CORPORATION, Item No. FM3311, number average molecular weight: 1000; corresponding to a compound in which $R_5$ and $R_8$ are a propylene group and $R_6$ and $R_7$ are a methyl group in the chemical formula (3)) diluted with 35 g of diglyme was added thereto dropwise, and the mixture was stirred at room temperature for 3 hours after the ice bath was removed. The subsequent steps were performed in the same manner as in Example 1 to give polyamide P-2. The GPC weight average molecular weight of P-2 in terms of polystyrene measured under the same conditions as in Example 1 was 90000.

Example 3

13.59 g (0.075 mol) of 5-aminoisophthalic acid, 68 g of GBL and 11.87 g (0.15 mol) of pyridine were introduced into a separable flask with a 1L volume, and the mixture was stirred and heated to 50° C. in a water bath. 12.26 g (0.079 mol) of 2-methacryloyloxyethyl isocyanate diluted with 12 g of GBL was added thereto dropwise using a dropping funnel and the mixture was stirred at 50° C. for about 2 hours.

Disappearance of 5-aminoisophthalic acid was observed by HPLC and then 22.07 g (0.075 mol) of biphenyl-3,3',4,4'-tetracarboxylic dianhydride, 20.11 g (0.155 mol) of 2-hydroxyethyl methacrylate, 11.87 g (0.15 mol) of pyridine and 84 g of GBL were introduced into the flask and mixed, and the mixture was stirred at 50° C. for 2 hours and then at room temperature for 10 hours.

The procedures including and following the introduction of dicyclohexylcarbodiimide were performed in the same manner as in Example 2 to give polyamide P-3. The GPC weight average molecular weight of P-3 in terms of polystyrene measured under the same conditions as in Example 1 was 87500.

Example 4

36.23 g (0.2 mol) of 5-aminoisophthalic acid, 181 g of GBL, 31.64 g (0.4 mol) of pyridine and 32.83 g (0.2 mol) of 5-norbornene-2,3-dicarboxylic anhydride were introduced into a separable flask with a 1L volume, and the mixture was stirred and heated to 50° C. in an oil bath and allowed to react in that state for 24 hours. Disappearance of 5-aminoisophthalic acid was observed by HPLC and then the reaction solution was introduced into 5 liter of ion exchange water at once to precipitate the reaction product in the form of fine crystal powder. The powder was collected by filtration, washed with water and vacuum dried at 40° C. for 60 hours to give a norbornene imide blocked 5-aminoisophthalic acid (molecular weight: 327.29).

22.07 g (0.075 mol) of biphenyl-3,3',4,4'-tetracarboxylic dianhydride, 20.11 g (0.155 mol) of 2-hydroxyethyl methacrylate, 11.87 g (0.15 mol) of pyridine and 84 g of GBL were introduced into a separable flask with a 1L volume and mixed, and the mixture was stirred at 50° C. for 2 hours and then at room temperature for 10 hours.

24.55 g (0.075 mol) of the norbornene imide blocked 5-aminoisophthalic acid separately prepared as described above, 49 g of GBL and 11.87 g (0.15 mol) of pyridine were further added to the flask, and the mixture was heated and stirred at 50° C. for about 30 minutes to dissolve the components.

The procedures including and following the introduction of dicyclohexylcarbodiimide were performed in the same manner as in Example 2 to give polyamide P-4. The GPC weight average molecular weight of P-4 in terms of polystyrene measured under the same conditions as in Example 1 was 56700.

Comparative Example 1

44.13 g (0.15 mol) of biphenyl-3,3',4,4'-tetracarboxylic dianhydride, 40.21 g (0.309 mol) of 2-hydroxyethyl methacrylate, 23.73 g (0.3 mol) of pyridine and 169 g of GBL were introduced into a separable flask with a 1 L volume and mixed, and the mixture was stirred at 50° C. for 2 hours and then at room temperature for 10 hours.

The procedures including and following the introduction of dicyclohexylcarbodiimide were performed in the same manner as in Example 2 to give polyamide P-5. The GPC weight average molecular weight of P-5 in terms of polystyrene measured under the same conditions as in Example 1 was 85200.

Comparative Example 2

310.22 g (1.00 mol) of diphenyl ether-3,3',4,4'-tetracarboxylic dianhydride, 270.69 g (2.08 mol) of 2-hydroxyethyl methacrylate, 158.2 g (2.00 mol) of pyridine and 1000 g of GBL were introduced into a separable flask with a 5 L volume and mixed, and the mixture was stirred at room temperature for 16 hours. 400.28 g (1.94 mol) of dicyclohexylcarbodiimide dissolved and diluted in 400 g of GBL was added thereto dropwise over about 30 minutes in an ice bath and then 185.97 g (0.93 mol) of 4,4'-diaminodiphenyl ether dispersed in 650 g of GBL was added thereto over about 60 minutes. The mixture was stirred for 3 hours still in the ice bath and 50 g of ethanol was then added thereto. The ice bath was removed and the mixture was stirred for an additional hour. Precipitate from the dehydration condensing agent (dicyclohexylurea) was removed by filtration under pressure and then the reaction solution was added dropwise to 40 L of ethanol. The polymer precipitated at that stage was separated, washed and vacuum dried at 50° C. for 24 hours to give polyamide P-6. The GPC weight average molecular weight of P-6 in terms of polystyrene measured under the same conditions as in Example 1 was 92600.

<Preparation of Resin Composition>

Example 5

100 parts by mass of polyamide (P-1) obtained in Example 1, 4 parts by mass of tetraethylene glycol dimethacrylate, 4 parts by mass of 1,3-diphenylpropanetrione-2-(O-ethoxycarbonyl)oxime, 1 part by mass of 1-phenyl-5-mercapto-1,2,3,4-tetrazole, 3 parts by mass of N,N-bis(2-hydroxyethyl)aniline, 0.05 part by mass of N-nitrosodiphenylamine and 10 parts by mass of hexamethoxymethylated melamine were dissolved in a mixed solvent of 194 parts by mass of N-methyl-2-pyrrolidone and 48 parts by mass of benzyl alcohol. The mixture was filtrated through a polytetrafluoroethylene filter with a pore size of 0.2 µm to give resin composition V-1 in the form of varnish.

Example 6

Resin composition V-2 in the form of varnish was obtained in the same manner as in Example 5 except that polyamide (P-2) obtained in Example 2 was used instead of P-1.

Example 7

Resin composition V-3 in the form of varnish was obtained in the same manner as in Example 5 except that polyamide (P-3) obtained in Example 3 was used instead of P-1.

Example 8

Resin composition V-4 in the form of varnish was obtained in the same manner as in Example 5 except that polyamide (P-4) obtained in Example 4 was used instead of P-1.

Comparative Example 3

Resin composition V-5 in the form of varnish was obtained in the same manner as in Example 5 except that polyamide (P-5) obtained in Comparative Example 1 was used instead of P-1.

Comparative Example 4

Resin composition V-6 in the form of varnish was obtained in the same manner as in Example 5 except that polyamide (P-6) obtained in Comparative Example 2 was used instead of P-1.

<Preparation of Polyamide Resin Film and Evaluation of Lithography>

The resin composition in the form of varnish obtained in the above-described Examples 5 to 8 and Comparative Examples 3 and 4 was each applied to a 5 inch silicon wafer previously subjected to substrate treatment with 3-aminopropyltriethoxysilane using a spin coater (manufactured by Tokyo Electron Limited, model name: Clean Track Mark 7) and prebaked at 95° C. for 4 minutes to prepare a coating film having an initial film thickness of 10 μm.

The coating film was exposed through a photomask for evaluation by an i-line wafer stepper (manufactured by Nikon Corporation, model name: NSR2005i8A) with the exposure gradually changed by a step of 50 mJ/cm$^2$ in the range of 50 to 600 mJ/cm$^2$. 30 minutes after the exposure, development was performed by rotary spraying using a 50/50(% by volume) mixed solvent of gamma butyrolactone and xylene as a developer for the period calculated by multiplying the time for unexposed portions to be completely dissolved and disappear by 1.4, followed by rotary spray rinsing with isopropanol for 10 seconds to give a relief pattern formed from the polyamide resin film.

The resulting relief pattern was visually observed by a light microscope, and the lowest exposure (sensitivity) at which a sharp pattern can be produced without swelling and the dimension of via holes (developed and eluted portions in a rectangle) (resolution) when irradiated at the lowest exposure were evaluated. The results are shown in Table 2.

<Measurement of Residual Stress of Polyamide-Imide Resin Film>

Each of the compositions obtained in the above-described Examples 5 to 8 and Comparative Examples 3 and 4 was applied to a 5 inch silicon wafer having a thickness of 625 μm±25 μm whose "warpage" was previously measured using a residual stress measurement apparatus (manufactured by KLA-Tencor Corporation, model name: FLX-2320) and prebaked in the same manner as in the above-described evaluation of lithography. Then, it was heat-cured at 350° C. for 2 hours under nitrogen atmosphere using a vertical curing furnace (manufactured by KOYO THERMO SYSTEMS CO., LTD., model name: VF-2000B) to prepare silicon wafers with a film of the polyamide-imide resin (Examples 5 to 8) or the polyimide resin (Comparative Examples 3 and 4) having a film thickness after curing of 10 μm. The residual stress of the wafers was measured by the aforementioned residual stress measurement apparatus. The results are shown in Table 2.

<Measurement of Glass Transition Temperature Tg of Polyamide-Imide Resin Film>

The composition obtained in the above-described Examples 5 to 8 and Comparative Examples 3 and 4 was each applied to a 5 inch silicon wafer and prebaked in the same manner as in the above-described evaluation of lithography. Then, it was heat-cured at 350° C. for 2 hours under nitrogen atmosphere using a vertical curing furnace (manufactured by KOYO THERMO SYSTEMS CO., LTD., model name: VF-2000B) to prepare a polyamide-imide resin film (Examples 5 to 8) or a polyimide resin (Comparative Examples 3 and 4) having a film thickness after curing of 10 μm. The resin film was cut into pieces of 3.0 mm wide using a dicing saw (manufactured by DISCO CORPORATION, model name: DAD-2H/6T) and peeled off from the silicon wafer by dipping in an aqueous hydrofluoric acid solution to prepare strip-shaped film samples.

The glass transition temperature (Tg) of the film samples was measured using an apparatus for thermomechanical analysis (manufactured by Shimadzu Corporation, model name: TMA-50). For the measurement conditions, the sample length was 10 mm, the constant load was 200 g/mm$^2$, the measurement temperature range was 25° C. to 450° C., the temperature increase rate was 10° C./min and the atmosphere was nitrogen. The results are shown in Table 2.

In Examples of the present invention, coating films having high heat resistance can be obtained. Further, in Examples using diaminopolysiloxane as part of the diamine compound (Examples 6 to 8), coating films having high heat resistance and low residual stress can be obtained.

TABLE 1

| | Acid component (% by mole) | | Diamine component (% by mole) | |
|---|---|---|---|---|
| Example 1 | BPDA(50) | AIPA-M(50) | BAPS(100) | — |
| Example 2 | BPDA(80) | AIPA-M(20) | BAPS(87) | FM3311(13) |
| Example 3 | BPDA(50) | AIPA-M(50) | BAPS(87) | FM3311(13) |
| Example 4 | BPDA(50) | AIPA-N(50) | BAPS(87) | FM3311(13) |
| Comparative Example 1 | BPDA(100) | — | BAPS(87) | FM3311(13) |
| Comparative Example 2 | ODPA(100) | — | DADPE(100) | — |

| | |
|---|---|
| BPDA: | biphenyl-3,3-,4,4'-tetracarboxylic dianhydride |
| ODPA: | diphenyl ether-3,3',4,4'-tetracarboxylic dianhydride |
| AIPA-M: | 2-methacryloyloxyethyl isocyanate blocked 5-aminoisoplithalic acid |
| AIPA-N: | 5-norbornene-2,3-dicarboxylic anhydride (imidated) blocked 5-aminoisophthalic acid |
| BAPS: | bis[4-(4-aminophenoxy)phenyl]sulfone |
| FM3311: | diaminopolysiloxane manufactured by CHISSO CORPORATION, number average molecular weight: 1000 |
| DADPE: | 4,4'-diaminodiphenyl ether |

TABLE 2

| | Sensitivity (mJ/cm$^2$) | resolution (μm) | residual stress (MPa) | Tg (° C.) |
|---|---|---|---|---|
| Example 5 | 100 | 8 | 28 | 315 |
| Example 6 | 150 | 8 | 22 | 280 |
| Example 7 | 150 | 8 | 20 | 290 |
| Example 8 | 200 | 8 | 19 | 310 |
| Comparative Example 3 | 200 | 8 | 24 | 230 |
| Comparative Example 4 | 150 | 6 | 36 | 245 |

INDUSTRIAL APPLICABILITY

The polyamide of the present invention is suitable for forming a heat resistant coating film for electronic parts or semiconductor devices.

The invention claimed is:

1. A polyamide having a structure represented by the chemical formula (1):

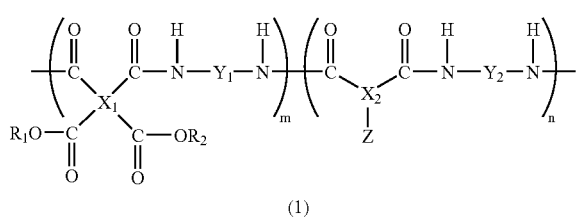

(1)

wherein m and n represent an integer satisfying $m \geq 1$, $n \geq 1$, $2 \leq (m+n) \leq 150$ and $0.3 \leq m/(m+n) \leq 0.9$, repeating units may be arranged blockwise or randomly, $R_1$ and $R_2$ each independently represent at least one monovalent organic group containing a photopolymerizable unsaturated bond, a —$COOR_1$ group and a —$COOR_2$ group are each at an ortho position relative to a —CONH— group adjacent thereto, $X_1$ represents at least one tetravalent aromatic group, $X_2$ represents at least one trivalent aromatic group, $Y_1$ and $Y_2$ each independently represent at least one divalent organic group, and Z represents at least one monovalent organic group selected from the groups represented by the following chemical formula (2):

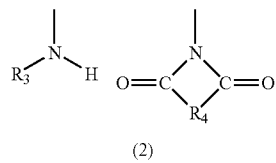

(2)

wherein $R_3$ represents at least one monovalent organic group having 1 to 9 carbon atoms and $R_4$ represents at least one divalent organic group having 1 to 9 carbon atoms.

2. The polyamide according to claim 1, wherein part of $Y_1$ and $Y_2$ represents a divalent siloxane group represented by the following chemical formula (3):

[Formula 3]

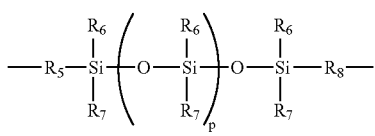

(3)

wherein p represents an integer of 0 to 50, $R_5$ and $R_8$ represent a divalent hydrocarbon group which may be the same or different and $R_6$ and $R_7$ represent a monovalent hydrocarbon group which may be the same or different.

3. A resin composition having negative photosensitivity, comprising 100 parts by mass of the polyamide according to claim 1 and 0.5 to 20 parts by mass of a photopolymerization initiator.

4. A process for forming a cured relief pattern, comprising the steps of:
   applying the resin composition according to claim 3 to a substrate,
   exposing the resulting coating film to an active light through a patterning mask or directly irradiating the coating film with an actinic ray,
   dissolving and removing an unexposed portion or a non-irradiated portion of the coating film using a developer, and
   heating the resulting negative relief pattern at 200 to 400° C.

5. The process for forming a cured relief pattern according to claim 4, wherein the active light is i-line.

6. A process for manufacturing a semiconductor device, comprising the process for forming a cured relief pattern according to claim 4.

7. A semiconductor device comprising a coating film composed of a resin obtained by curing the resin composition according to claim 3.

8. A resin composition having negative photosensitivity, comprising 100 parts by mass of the polyamide according to claim 2 and 0.5 to 20 parts by mass of a photopolymerization initiator.

9. A process for forming a cured relief pattern, comprising the steps of:
   applying the resin composition according to claim 8 to a substrate,
   exposing the resulting coating film to an active light through a patterning mask or directly irradiating the coating film with an actinic ray,
   dissolving and removing an unexposed portion or a non-irradiated portion of the coating film using a developer, and
   heating the resulting negative relief pattern at 200 to 400° C.

10. The process for forming a cured relief pattern according to claim 9, wherein the active light is i-line.

11. A process for manufacturing a semiconductor device, comprising the process for forming a cured relief pattern according to claim 5.

12. A process for manufacturing a semiconductor device, comprising the process for forming a cured relief pattern according to claim 9.

13. A semiconductor device comprising a coating film composed of a resin obtained by curing the resin composition according to claim 8.

* * * * *